United States Patent
Koyo et al.

(10) Patent No.: US 10,416,353 B2
(45) Date of Patent: Sep. 17, 2019

(54) LOW-REFLECTION COATING, LOW-REFLECTION COATED SUBSTRATE, AND PHOTOELECTRIC CONVERSION DEVICE

(71) Applicant: Nippon Sheet Glass Company, Limited, Tokyo (JP)

(72) Inventors: Mizuho Koyo, Hyogo (JP); Fumiyoshi Kondo, Kyoto (JP); Yoko Miyamoto, Hyogo (JP); Mitsuhiro Kawazu, Hyogo (JP); Hirofumi Matsubara, Hyogo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 207 days.

(21) Appl. No.: 15/322,670

(22) PCT Filed: Jun. 30, 2015

(86) PCT No.: PCT/JP2015/003300
§ 371 (c)(1),
(2) Date: Dec. 28, 2016

(87) PCT Pub. No.: WO2016/002215
PCT Pub. Date: Jan. 7, 2016

(65) Prior Publication Data
US 2017/0139080 A1    May 18, 2017

(30) Foreign Application Priority Data
Jun. 30, 2014  (JP) ................. 2014-134177

(51) Int. Cl.
*G02B 1/11*    (2015.01)
*C03C 17/00*   (2006.01)
(Continued)

(52) U.S. Cl.
CPC ............ *G02B 1/111* (2013.01); *C03C 17/007* (2013.01); *C03C 17/25* (2013.01); *C03C 17/253* (2013.01);
(Continued)

(58) Field of Classification Search
CPC ........... G02B 1/00; G02B 1/11; C03C 17/007; C03C 17/30; H01L 31/048; H01L 31/0481; C09D 5/006
See application file for complete search history.

(56) References Cited

U.S. PATENT DOCUMENTS

| 6,623,820 | B1 * | 9/2003 | Nakahara ............. B41M 5/5218 |
| | | | 106/286.8 |
| 2013/0163087 | A1 * | 6/2013 | Lecolley ............... C03C 17/007 |
| | | | 359/601 |

(Continued)

FOREIGN PATENT DOCUMENTS

| JP | 2005330172 | 12/2005 |
| JP | 2006117526 | 5/2006 |

(Continued)

OTHER PUBLICATIONS

International Search Report for PCT/JP2015/003300, dated Oct. 6, 2015, 3 pages including English translation.

*Primary Examiner* — Mark Kopec
(74) *Attorney, Agent, or Firm* — Hamre, Schumann, Mueller & Larson, P.C.

(57) ABSTRACT

A low-reflection coating of the present invention is a porous film including: fine silica particles being solid and spherical and having an average particle diameter of 80 to 150 nm; and a binder containing silica as a main component, the fine silica particles being bound together by the binder. The binder further contains an aluminum compound. The low-reflection coating contains, as components, 55 to 70 mass % of the fine silica particles, 25 to 40 mass % of the silica of (Continued)

the binder, and 2 to 7 mass % of the aluminum compound in terms of $Al_2O_3$. The low-reflection coating has a thickness of 80 to 800 nm. The low-reflection coating yields a transmittance gain of 2.5% or more when provided on the substrate. The transmittance gain represents an increase in average transmittance of the substrate provided with the low-reflection coating relative to the substrate not provided with the low-reflection coating, the average transmittance being measured in the wavelength range of 380 to 850 nm.

13 Claims, 2 Drawing Sheets

(51) Int. Cl.
- *C09D 5/00* (2006.01)
- *G02B 1/111* (2015.01)
- *C03C 17/25* (2006.01)
- *G02B 1/113* (2015.01)
- *H01L 31/048* (2014.01)
- *H01L 31/0216* (2014.01)

(52) U.S. Cl.
CPC ........ *G02B 1/113* (2013.01); *H01L 31/02168* (2013.01); *H01L 31/048* (2013.01); *C03C 2217/211* (2013.01); *C03C 2217/213* (2013.01); *C03C 2217/214* (2013.01); *C03C 2217/42* (2013.01); *C03C 2217/425* (2013.01); *C03C 2217/465* (2013.01); *C03C 2217/478* (2013.01); *C03C 2217/73* (2013.01); *C03C 2217/732* (2013.01); *C03C 2217/948* (2013.01); *C03C 2218/118* (2013.01); *C03C 2218/365* (2013.01)

(56) References Cited

U.S. PATENT DOCUMENTS

| | | |
|---|---|---|
| 2015/0177425 A1 | 6/2015 | Kondo et al. |
| 2015/0346400 A1* | 12/2015 | Patel .................. G02B 5/124 |
| | | 359/536 |

FOREIGN PATENT DOCUMENTS

| | | |
|---|---|---|
| JP | 2013537873 | 10/2013 |
| JP | 2014015543 | 1/2014 |
| JP | 2014032248 | 2/2014 |
| WO | 2012008427 | 1/2012 |

* cited by examiner

LOW-REFLECTION COATING, LOW-REFLECTION COATED SUBSTRATE, AND PHOTOELECTRIC CONVERSION DEVICE

TECHNICAL FIELD

The present invention relates to a low-reflection coating, a low-reflection coated substrate including the low-reflection coating, and a photoelectric conversion device.

BACKGROUND ART

For the purpose of improving the function of a glass or ceramic substrate in its intended use, a low-reflection coating for increasing the amount of light to be transmitted or for preventing glare caused by reflection is formed on the surface of the substrate.

Such low-reflection coatings are applied, for example, to glass sheets for use in vehicle glass panes, show-windows, or photoelectric conversion devices. A so-called thin-film solar cell, which is a type of photoelectric conversion device, employs a glass sheet on which is formed a stack of an underlayer film, a transparent conductive film, a photoelectric conversion layer made of amorphous silicon or the like, and a back-side thin-film electrode that are arranged in this order. A low-reflection coating is formed on the principal surface of the glass sheet opposite to the principal surface bearing the stack, i.e., on the principal surface on which sunlight is incident. Such a solar cell having a low-reflection coating formed on the sunlight-incident side allows an increased amount of sunlight to reach the photoelectric conversion layer or solar cell element and thus generates an increased amount of electricity.

The best-used low-reflection coatings are dielectric films produced by vacuum deposition, sputtering, or chemical vapor deposition (CVD). In some cases, a fine particle-containing film containing fine particles such as fine silica particles is used as a low-reflection coating. Such a fine particle-containing film is formed by applying a coating liquid containing fine particles to a transparent substrate by a technique such as dipping, flow coating, or spraying.

For example, JP 2014-032248 A (Patent Literature 1) discloses a cover glass for photoelectric conversion devices that is formed by applying a coating liquid containing fine particles and a binder precursor to a glass sheet having surface asperities by spraying, followed by drying at 400° C. and then by calcining at 610° C. for 8 minutes. The low-reflection coating of this cover glass can yield an increase of at least 2.37% in the average transmittance for light having wavelengths ranging from 380 to 1100 nm.

Furthermore, JP 2013-537873 A (Patent Literature 2) discloses a coated glass substrate produced by depositing a sol containing tetraethoxysilane, aluminum acetylacetonate, and colloidal silica on a glass sheet by dip coating, followed by heat treatment at 680° C. for 180 seconds. The low-reflection coating provided on this glass substrate yields an increase of 2.5% in the average average transmittance for light having wavelengths ranging from 300 to 1100 nm.

JP 2014-015543 A (Patent Literature 3) discloses a silicon substrate with a coating formed by applying a coating composition containing a colloidal silica, tetraalkoxysilane, and aluminum nitrate to the substrate using a spin coater and then by drying the applied coating composition at 100° C. for 1 minute, the colloidal silica having a dispersed particle diameter greater than an average primary particle diameter and having a shape factor and aspect ratio that are larger than 1 by a certain amount or more. This coating has a refractive index of 1.40 or less, although there is no mention of the increase in average light transmittance brought about by this coating.

CITATION LIST

Patent Literature

Patent Literature 1: JP 2014-032248 A
Patent Literature 2: JP 2013-537873 A
Patent Literature 3: JP 2014-015543 A

SUMMARY OF INVENTION

Technical Problem

To evaluate the effect of a low-reflection coating, it is important to consider a property called "transmittance gain". The transmittance gain corresponds to an increase in transmittance, such as an increase in average transmittance in a predetermined wavelength range, achieved by provision of the low-reflection coating. Specifically, the transmittance gain is determined as a value obtained by subtracting a transmittance of a substrate not provided with a coating from a transmittance of the substrate provided with the coating.

For example, in the case of a photoelectric conversion device employing a glass sheet having a light-incident surface provided with a low-reflection coating, a higher transmittance gain means that the glass sheet permits transmission of a larger amount of light and the photoelectric conversion device has higher efficiency. The cover glass described in Patent Literature 1 and the glass substrate described in Patent Literature 2 leave room for improvement in transmittance gain.

In production of a photoelectric conversion device employing a glass sheet, it has been conventional to provide a low-reflection coating on a glass sheet beforehand and use the glass sheet to produce the photoelectric conversion device. However, in this method, the low-reflection coating provided beforehand may be accidentally damaged or contaminated or suffer from deterioration in low-reflection properties during the production process of the photoelectric conversion device.

In view of these circumstances, the present invention aims to provide a low-reflection coating adapted to be provided on a light-incident surface of a photoelectric conversion device after the photoelectric conversion device is produced using a glass sheet not provided with any low-reflection coating. The present invention further aims to provide a low-reflection coated substrate and photoelectric conversion device that include such a low-reflection coating.

Solution to Problem

The present invention provides a low-reflection coating adapted to be provided on at least one principal surface of a substrate,
the low-reflection coating being a porous film including: fine silica particles being solid and spherical and having an average particle diameter of 80 to 150 nm; and a binder containing silica as a main component, the fine silica particles being bound together by the binder.
The binder further contains an aluminum compound,
the low-reflection coating contains as components:
55 to 70 mass % of the fine silica particles;
25 to 40 mass % of the silica of the binder; and 2 to 7 mass % of the aluminum compound in terms of $Al_2O_3$, the low-reflection coating has a thickness of 80 to 800 nm, and the low-reflection coating yields a transmittance gain of 2.5% or more when provided on the substrate. The transmittance gain is defined as an increase in average transmittance of the substrate provided with the low-reflection coating relative to the substrate not provided with the low-reflection coating, the average transmittance being measured in the wavelength range of 380 to 850 nm.

The present invention also provides a low-reflection coated substrate including:

a glass sheet; and the low-reflection coating according to the present invention formed on at least one principal surface of the glass sheet.

The present invention also provides a photoelectric conversion device including:

a glass sheet; and the low-reflection coating according to the present invention formed on a principal surface of the glass sheet, the principal surface being a surface on which light is incident.

Advantageous Effects of Invention

The low-reflection coating of the present invention yields a transmittance gain of 2.5% or more by virtue of containing predetermined amounts of solid fine silica particles having an average particle diameter within a predetermined range and a binder containing silica as a main component. By virtue of the fact that the binder in the low-reflection coating of the present invention contains a predetermined amount of aluminum compound, the low-reflection coating of the present invention can be endowed with high salt spray resistance without the need to perform high-temperature treatment in a heating step following application of a coating liquid to a substrate.

EMBODIMENTS OF INVENTION

Figure 1:
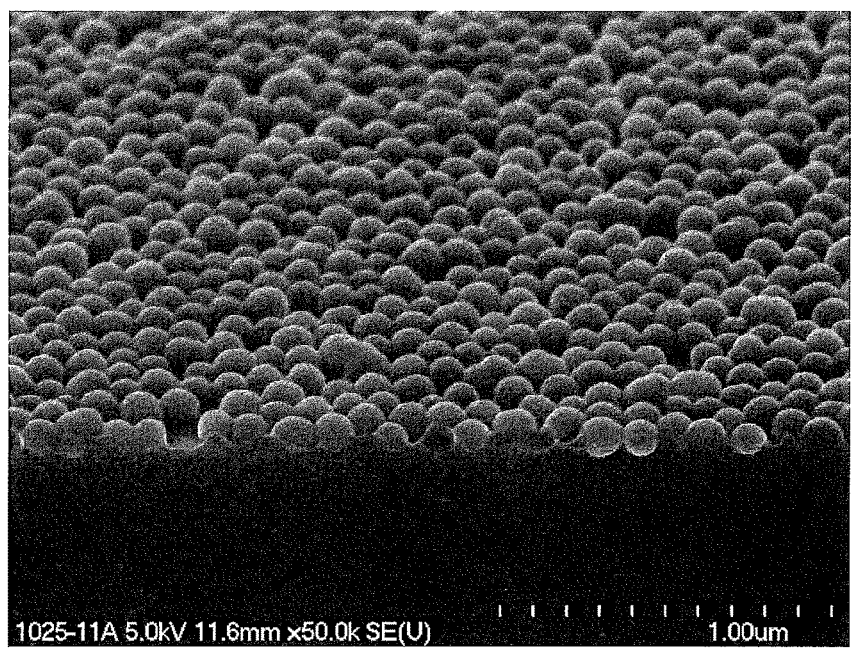
FIG. 1 shows a result of field emission scanning electron microscope (FE-SEM) observation of a low-reflection coated substrate obtained in Example 1.

The low-reflection coating of the present invention includes a porous film including: fine silica particles being solid and spherical; and a binder containing silica as a main component, the fine silica particles being bound together by the binder. The binder further contains an aluminum compound. The porous film, i.e., the low-reflection coating, has a physical thickness of 80 to 800 nm, preferably more than 100 nm and 500 nm or less, more preferably more than 100 nm and 150 nm or less.

The fine silica particles are approximately spherical primary particles having an average particle diameter of 80 to 150 nm, preferably more than 100 nm and 150 nm or less. Silica has higher hardness than organic polymer materials. Silica has a relatively low refractive index, thus being capable of offering a greater reduction in the apparent refractive index of the porous layer including the binder and the fine silica particles. Furthermore, approximately spherical primary particles made of silica and having well uniform diameters are commercially manufactured at low cost and are highly available in terms of the quantity, quality, and cost. The "average particle diameter" of the fine silica particles, as defined herein, refers to a particle diameter (D50) at 50% cumulative volume in a particle size distribution measured by laser-diffraction particle size distribution analysis.

The aluminum compound contained in the binder is preferably derived from an aluminum halide added to a coating liquid for forming the low-reflection coating. A preferred example of the aluminum halide is aluminum chloride.

In the low-reflection coating, the content of the aluminum compound is 2 to 7 mass % and preferably 5 to 7 mass % in terms of $Al_2O_3$.

When the low-reflection coating contains the aluminum compound in the above amount, the low-reflection coating has increased resistance to salt spray. If the content is less than 2 mass %, the salt spray resistance will deteriorate. If the content is more than 7 mass %, the transmittance gain offered by the low-reflection coating will decrease.

When the aluminum halide added to the coating liquid is aluminum chloride, the heat treatment following the application of the coating liquid can be performed under milder conditions to obtain the increasing effect on salt spray resistance. Specifically, a coating having such a high salt spray resistance that the difference in the absolute value of average transmittance before and after a salt spray test is 0.15% or less can be obtained when the heating step (drying and curing step) following the application of the coating liquid is performed under low-temperature conditions where the maximum temperature to which the surface of the substrate coated with the coating liquid is exposed is 350° C. or lower and the duration during which the surface of the substrate has a temperature of 200° C. or higher is 5 minutes or less, preferably under low-temperature conditions where the maximum temperature to which the surface of the substrate is exposed is 250° C. or lower and the duration during which the surface of the substrate has a temperature of 100° C. or higher is 2 minutes or less.

The content of the fine silica particles in the low-reflection coating is 55 to 70 mass % and preferably 60 to 70 mass %. The content of the silica of the binder is 25 to 40 mass % and preferably 30 to 40 mass % in the low-reflection coating.

The ratio between the content of the fine silica particles and the content of the silica of the binder (fine silica particles:silica of binder) in the low-reflection coating is in the range of 70:30 to 30:70 and preferably in the range of 70:30 to 60:40 in terms of mass ratio. Increasing the ratio of the content of the fine silica particles leads to a higher reflectance gain offered by the low-reflection coating of the present invention. This is due to an increase in the spacing between the fine silica particles themselves and between the fine particles and the transparent substrate. If, however, the ratio of the content of the fine silica particles is excessively large, the durability of the low-reflection coating of the present invention will deteriorate. This is because an excessively large ratio of the content of the fine silica particles results in a reduction in the effect of the silica of the binder which serves to bond the fine silica particles together or bond the fine particles to the transparent substrate. If the ratio of the content of the fine silica particles is excessively small, the spacing mentioned above will be too narrow, with the result that the reflectance gain offered by the low-reflection coating of the present invention will decrease.

Hydrolyzable silicon compounds typified by silicon alkoxides can be used as a source of the silica of the binder. Examples of the silicon alkoxides include tetramethoxysilane, tetraethoxysilane, and tetraisopropoxysilane. Any of these hydrolyzable silicon compounds may be subjected to hydrolysis and polycondensation by a so-called sol-gel process to form the binder.

The hydrolysis of the hydrolyzable silicon compound can be carried out in any appropriate manner. The hydrolysis is preferably carried out in a solution containing the fine silica particles described above, because this promotes a polycondensation reaction between silanol groups present on the surfaces of the fine particles and silanol groups formed by hydrolysis of the hydrolyzable silicon compound such as a silicon alkoxide, thus leading to an increase in the proportion of the binder contributing to enhancement of bond strength between the fine silica particles. Specifically, it is preferable to prepare a coating liquid by sequentially adding a hydrolysis catalyst and a silicon alkoxide to a solution containing the fine silica particles while stirring the solution.

Either an acid or a base can be used as the hydrolysis catalyst. Acids, in particular inorganic acids such as hydrochloric acid, nitric acid, sulfuric acid, and phosphoric acid, are preferably used, and hydrochloric acid is more preferably used. This is because acidic conditions allow better dispersion of the fine silica particles and yield higher stability of the coating liquid than basic conditions. Furthermore, chlorine ions derived from hydrochloric acid contribute to an increase in the chlorine ion content in the coating liquid and thus enhance the effect brought about by the above-described aluminum chloride added to the coating liquid.

Consequently, the low-reflection coating of the present invention can yield a transmittance gain of 2.5% or more, preferably 2.6% or more, even more preferably 2.7% or more, and exhibit high salt spray resistance as described above.

The low-reflection coating of the present invention can be formed by applying, drying, and curing a coating liquid. For application of the coating liquid, any of known methods such as spin coating, roll coating, bar coating, dip coating, and spray coating can be used. Spray coating is advantageous in terms of mass production. Roll coating and bar coating are suitable in terms of the uniformity of appearance of the resulting coating film as well as in terms of mass production.

The substrate suitable for being provided with the low-reflection coating of the present invention may be a glass sheet having no coating. For example, it is possible to provide a low-reflection coated substrate having a glass sheet and the low-reflection coating of the present invention formed on at least one principal surface of the glass sheet. This glass sheet may be a float glass sheet having a principal surface having smoothness such that the arithmetic average roughness Ra of the principal surface is, for example, 1 nm or less and preferably 0.5 nm or less. The arithmetic average roughness Ra as defined herein corresponds to that as specified in JIS B 0601-1994.

The glass sheet used may also be a figured glass sheet having a surface with asperities. The mean spacing Sm of the asperities is preferably 0.3 mm or more, more preferably 0.4 mm or more, and particularly preferably 0.45 mm or more, and is preferably 2.5 mm or less, more preferably 2.1 mm or less, even more preferably 2.0 mm or less, and particularly preferably 1.5 mm or less. The mean spacing Sm as defined herein refers to an average of lengths of peak-valley periods in a roughness profile which are determined based on points at which the roughness profile intersects the mean line. It is further preferable that the surface asperities of the figured glass sheet have a maximum height Ry of 0.5 µm to 10 µm, in particular 1 µm to 8 µm, in addition to a mean spacing Sm within the above range. The mean spacing Sm and maximum height Ry as defined herein correspond to those as specified in JIS (Japanese Industrial Standards) B 0601-1994.

The glass sheet used may have a composition similar to those of typical figured glass sheets or architectural glass sheets, and is preferably free or substantially free of any coloring component. In the glass sheet, the content of iron oxide, which is a typical coloring component, is preferably 0.06 mass % or less and particularly preferably 0.02 mass % or less in terms of $Fe_2O_3$.

The reduction in reflectance achieved by providing the low-reflection coating of the present invention on a principal surface of a glass sheet, i.e., the reflectance improving effect of the low-reflection coating of the present invention, becomes greater as the average reflectance of the principal surface in the wavelength range of 380 to 850 nm increases. For example, a transmittance gain of 2.5% or more is likely to be achieved by using a glass sheet having a principal surface having an average reflectance of 5.1% or more in the wavelength range of 380 to 850 nm and by providing the low-reflection coating of the present invention on the principal surface. Furthermore, a transmittance gain of 2.7% or more is likely to be achieved when the average reflectance of the principal surface is 5.2% or more and preferably 5.3% or more.

A glass sheet having a principal surface having a high average reflectance as specified above can be obtained, for example, by controlling the tin oxide concentration in the principal surface. For example, a principal surface of a glass sheet can have a high average reflectance as specified above when the tin oxide concentration in the outermost portion of the principal surface is 3.5 to 24 mass %, preferably 3.5 to 21 mass %, more preferably 5 to 18 mass %, and particularly preferably 6 to 18 mass %.

When the glass sheet used is a float glass sheet produced by a float process, tin derived from a float bath (molten tin) is diffused in that surface of the glass sheet which is placed in contact with the float bath during production by the float process. The amount of tin entering the surface of the glass sheet can be so controlled by adjustment of the production conditions in the float bath that the glass sheet produced has a principal surface having a desired reflectance. For example, the composition of the molten tin can be adjusted by introducing an oxidation gas into the molten tin bath in such an amount as to oxidize a slight amount of the molten tin and by incorporating an iron component into the molten tin. The molten tin bath is allowed to maintain a reductive atmosphere by feed of nitrogen gas and hydrogen gas, and adjusting the gas pressure in the molten tin bath enables introduction of atmospheric oxygen, and hence feed of a slight amount of oxidation gas, into the molten tin bath. The amount of the oxidation gas to be fed to the molten tin bath can be regulated by fine adjustment of the concentration of hydrogen gas.

As described above, when the glass sheet used is a float glass sheet, it is preferable to provide the low-reflection coating of the present invention on that principal surface of the glass sheet which is placed in contact with a float bath during production by a float process. This allows the low-reflection coating of the present invention to exert a higher reflectance improving effect and consequently yield a higher transmittance gain. The foregoing has described a glass sheet having a principal surface with controlled tin oxide concentration as an example of a glass sheet having a principal surface having a high reflectance; however, the glass sheet used is not limited to such a glass sheet, and may be one that has a glass surface the reflectance of which has been increased by another known method.

The substrate suitable for being provided with the low-reflection coating of the present invention may be a transparent conductive film-coated glass substrate. The transparent conductive film-coated glass substrate is, for example, a glass substrate having a transparent conductive film formed over one principal surface of any of the glass sheets as described above, the glass substrate including one or more underlayers and a transparent conductive layer containing, for example, fluorine-doped tin oxide as a main component, the layers being stacked on the principal surface of the glass sheet in order.

EXAMPLES

Hereinafter, the present invention will be described in more detail by way of examples. The methods used in Examples and Comparative Examples for evaluation of various properties of each low-reflection coating formed on a substrate will first be described.

(Transmission Properties)

The transmission curve (transmission spectrum) of the substrate (glass sheet in the present examples) was measured using a spectrophotometer (UV-3100PC, manufactured by Shimadzu Corporation) before and after low-reflection coating formation. The average transmittance was calculated by averaging the values of transmittance over the wavelength range of 380 to 850 nm. The increase in average transmittance of the substrate provided with a low-reflection coating relative to the substrate not provided with the low-reflection coating was defined as the transmittance gain.

(SEM Observation)

Each coating was observed with a field emission scanning electron microscope (S-4500, manufactured by Hitachi, Ltd.). The thickness of the coating was measured at five points in a FE-SEM photograph, taken from above at an angle of 30°, of a cross-section of the coating, and the average of the measured values was employed as the thickness of the coating.

(Evaluation of Alkali Resistance)

The alkali resistance of each low-reflection coated substrate obtained was evaluated as follows. The low-reflection coated substrate was immersed in a saturated aqueous solution of calcium hydroxide at a temperature of 60° C. for 3 hours. The transmittance of the substrate was measured with the above spectrophotometer before and after the immersion, and the absolute value of the difference between the measured values was used as a measure to evaluate the alkali resistance.

(Evaluation of Salt Water Resistance)

A salt spray test was conducted to evaluate the salt water resistance of each low-reflection coating obtained. The average transmittance of the low-reflection coating provided on the substrate was measured in the same manner as described above, and then the low-reflection coating was exposed to salt spray under conditions according to JIS C 8917: 2005, Annex 4. After that, the average transmittance was measured again. The absolute value of the difference between the values of average transmittance measured before and after the exposure to salt spray was employed as a measure of the salt water resistance. The exposure to salt spray was carried out, specifically, by spraying the coating with a mist of aqueous NaCl solution having a temperature of 35° C. and a concentration of 5 mass % for 96 hours.

(Pressure Cooker Test)

A pressure cooker test, which is a type of accelerating test, was conducted to evaluate the moisture resistance of each low-reflection coating obtained. The pressure cooker test in the present invention consisted of two repetitions of a test cycle in which the low-reflection coating provided on the substrate was held in a testing chamber set at a temperature of 130° C., a pressure of 2 atmospheres, and a humidity of 100% for 1 hour, then the applied pressure was removed, and then the coating was taken out of the chamber and left to cool to room temperature. The average transmittance was measured before and after this test, and the absolute value of the difference between the measured values of average transmittance was employed as a measure of the moisture resistance in the pressure cooker test.

Example 1

<Preparation of Coating Liquid>

An amount of 28.3 parts by mass of a fine silica particle dispersion (Quartron PL-7, manufactured by FUSO CHEMICAL CO., LTD., containing approximately spherical primary particles with an average particle diameter of 125 nm, and having a solids concentration of 23 wt %), 58.6 parts by mass of 1-methoxy-2-propanol (solvent), and 1 part by mass of 1N hydrochloric acid (hydrolysis catalyst) were mixed by stirring, and 12.1 parts by weight of tetraethoxysilane (ethyl orthosilicate, manufactured by TAMA CHEMICALS CO., LTD.) was added to the mixture under continuous stirring. The stirring was continued for additional 8 hours while maintaining a temperature of 40° C. to hydrolyze the tetraethoxysilane, thus yielding a raw material liquid A.

In the raw material liquid A, the ratio between the mass of the fine silica particles in terms of $SiO_2$ and the mass of the silicon oxide component of the binder in terms of $SiO_2$ was 65:35, and the concentration of solids in terms of $SiO_2$ was 10 wt %.

An amount of 70.0 g of the raw material liquid A, 2.0 g of propylene glycol (solvent), 26.3 g of 1-methoxy-2-propanol (solvent), and 1.7 g of an aqueous aluminum chloride solution (solution having an $AlCl_3$ concentration of 47.6 wt % and prepared by dissolving reagent grade aluminum chloride hexahydrate manufactured by Sigma-Aldrich Co., LLC. in deionized water) were mixed by stirring to obtain a coating liquid A1. In the coating liquid A1, the concentration of solids of silicon oxide (derived from the fine silica particles and tetraalkoxysilane) in terms of $SiO_2$ was 7.0 wt %, and the amount of the aluminum compound in terms of $Al_2O_3$ relative to 100 parts by mass of the silicon oxide in terms of $SiO_2$ was 5 parts by mass.

<Formation of Low-Reflection Coating>

In Example 1, a low-reflection coating was formed on one of the principal surfaces of a transparent conductive film-coated glass sheet to obtain a low-reflection coated substrate. This glass sheet was a 3.2-mm-thick glass sheet manufactured by Nippon Sheet Glass Co. Ltd., having a typical soda-lime-silicate composition, and having one principal surface coated with a transparent conductive film formed by on-line CVD and including a transparent conductive layer. This glass sheet was cut into a 200 mm×300 mm piece, which was immersed in an alkaline solution (LBC-1, an alkaline cleaning liquid, manufactured by LEYBOLD CO., LTD.) and washed using an ultrasonic cleaner. The piece of glass sheet was rinsed with deionized water and then dried at ordinary temperature to prepare a glass sheet for low-reflection coating formation. The transmission properties of this glass sheet not provided with a low-reflection coating were evaluated in the manner described above, and the average transmittance was determined to be 80.0%.

In Example 1, the coating liquid A1 was applied using a roll coater to the principal surface of the above glass sheet opposite to the principal surface provided with the transparent conductive film. The application of the coating liquid was done in such a manner that the applied liquid formed a film having a thickness of 1 to 5 μm. The coating liquid applied to the glass sheet was then dried and cured by hot air. This hot air drying was performed by using a belt conveyor-type hot air dryer and moving the conveyor in two opposite directions twice to pass the glass sheet under a hot air injection nozzle four times, with the temperature of hot air set to 300° C., the distance between the nozzle and glass sheet set to 5 mm, and the conveyance speed set to 0.5 m/min. In this drying, the duration during which the glass sheet coated with the coating liquid was in contact with hot air was 140 seconds, and the highest temperature of the glass surface coated with the coating liquid was 199° C. After the drying and curing, the glass sheet was left to cool to room temperature. In this way, a low-reflection coating was provided on the glass sheet.

The above various properties of the low-reflection coating thus obtained were evaluated. The results are shown in Table 1. In addition, a result of FE-SEM observation of a cross-section of the low-reflection coated substrate is shown in FIG. 1.

Example 2

<Preparation of Coating Liquid>

A coating liquid A2 was prepared. The ratio between the mass of the fine silica particles in terms of $SiO_2$ and the mass of the silicon oxide component of the binder in terms of $SiO_2$ was 65:35 (this ratio will hereinafter be referred to as "fine particles:binder ratio") in the coating liquid. The preparation was done in the same manner as for the coating liquid A1, except for changing the amounts of the aqueous aluminum chloride solution and solvents so that the amount of the aluminum compound relative to 100 parts by mass of silicon oxide (the mass of the fine silica particles in terms of $SiO_2$ plus the mass of the silicon oxide component of the binder in terms of $SiO_2$) was 3 parts by mass (this relative amount of the aluminum compound will hereinafter be referred to as "aluminum compound content") in the coating liquid. In the coating liquid A2, the concentration of solids of silicon oxide was 7.0 wt %.

<Formation of Low-Reflection Coating>

In Example 2, a low-reflection coating was formed in the same manner as in Example 1 except for using the coating liquid A2, and the various properties of the low-reflection coating were evaluated. The results are shown in Table 1.

Example 3

<Preparation of Coating Liquid>

A coating liquid A3 was prepared. The fine particles:binder ratio was 65:35 in the coating liquid. The preparation was done in the same manner as for the coating liquid A1, except for changing the amounts of the aqueous aluminum chloride solution and solvents so that the aluminum compound content was 7 parts by mass in the coating liquid. In the coating liquid A3, the concentration of solids of silicon oxide was 7.0 wt %

<Formation of Low-Reflection Coating>

In Example 3, a low-reflection coating was formed in the same manner as in Example 1 except for using the coating liquid A3, and the various properties of the low-reflection coating were evaluated. The results are shown in Table 1.

Example 4

<Preparation of Coating Liquid>

A coating liquid A4 was prepared in the same manner as the coating liquid A1, except for using a raw material liquid prepared in a similar manner to that for the raw material liquid A so that the fine particles:binder ratio was 70:30 and except for changing the amount of the aqueous aluminum chloride solution so that the aluminum compound content was 5.5 parts by mass. In the coating liquid A4, the concentration of solids of silicon oxide was 7.0 wt %.

<Formation of Low-Reflection Coating>

In Example 4, a low-reflection coating was formed in the same manner as in Example 1 except for using the coating liquid A4, and the various properties of the low-reflection coating were evaluated. The results are shown in Table 1.

Example 5

<Preparation of Coating Liquid>

A coating liquid A5 was prepared in the same manner as the coating liquid A1, except for using a raw material liquid prepared in a similar manner to that for the raw material liquid A so that the fine particles:binder ratio was 60:40 and except for changing the amount of the aqueous aluminum chloride solution so that the aluminum compound content was 5 parts by mass. In the coating liquid A5, the concentration of solids of silicon oxide was 7.0 wt %.

<Formation of Low-Reflection Coating>

In Example 5, a low-reflection coating was formed in the same manner as in Example 1 except for using the coating liquid A5, and the various properties of the low-reflection coating were evaluated. The results are shown in Table 1.

Example 6

<Aging Following Drying and Curing>

The low-reflection coating of Example 1 was subjected to aging. In this aging, the low-reflection coating was placed in an electric furnace set at 70° C. for 7 days and then left to cool to room temperature. This aging corresponds to the temperature history that the low-reflection coating of the present invention will undergo when a photoelectric conversion device including a glass sheet provided with the low-reflection coating is implemented to generate electricity from sunlight.

The various properties of the low-reflection coating subjected to the aging were evaluated. The results are shown in Table 1.

Comparative Example 1

<Preparation of Coating Liquid>

A coating liquid B1 was prepared. The fine particles:binder ratio was 65:35 in the coating liquid. The preparation was done in the same manner as for the coating liquid A1, except for changing the amount of the aqueous aluminum chloride solution so that the aluminum compound content was 0 in the coating liquid. In the coating liquid B1, the concentration of solids of silicon oxide was 7.0 wt %.

<Formation of Low-Reflection Coating>

In Comparative Example 1, a low-reflection coating was formed in the same manner as in Example 1 except for using the coating liquid B1, and the various properties of the low-reflection coating were evaluated. The results are shown in Table 1.

Comparative Example 2

<Preparation of Coating Liquid>

A coating liquid B2 was prepared. The fine particles:binder ratio was 65:35 in the coating liquid. The preparation was done in the same manner as for the coating liquid A1, except for changing the amount of the aqueous aluminum chloride solution so that the aluminum compound content was 1 part by mass in the coating liquid. In the coating liquid B2, the concentration of solids of silicon oxide was 7.0 wt %.

<Formation of Low-Reflection Coating>

In Comparative Example 2, a low-reflection coating was formed in the same manner as in Example 1 except for using the coating liquid B2, and the various properties of the low-reflection coating were evaluated. The results are shown in Table 1.

Comparative Example 3

<Preparation of Coating Liquid>

A coating liquid B3 was prepared. The fine particles:binder ratio was 65:35 in the coating liquid. The preparation was done in the same manner as for the coating liquid A1, except for changing the amount of the aqueous aluminum chloride solution so that the aluminum compound content was 10 parts by mass in the coating liquid. In the coating liquid B3, the concentration of solids of silicon oxide was 7.0 wt %.

<Formation of Low-Reflection Coating>

In Comparative Example 3, a low-reflection coating was formed in the same manner as in Example 1 except for using the coating liquid B3, and the various properties of the low-reflection coating were evaluated. The results are shown in Table 1.

Comparative Example 4

<Preparation of Coating Liquid>

An amount of 20.6 parts by mass of tetraethoxysilane identical to that used in Example 1, 2.15 parts by mass of an aqueous aluminum nitrate solution (solution having an $Al(NO_3)_3$ concentration of 10 wt % and prepared using reagent grade aluminum nitrate nonahydrate manufactured by Sigma-Aldrich Co., LLC.), and 78.0 parts by mass of ethanol were mixed, and the mixture was stirred for 8 hours while maintaining a temperature of 40° C. to hydrolyze the tetraethoxysilane, thus yielding a raw material liquid D. In the raw material liquid D, the content of solids of tetraalkoxysilane in terms of $SiO_2$ was 5.9 wt %, and the content of solids of aluminum nitrate in terms of $Al_2O_3$ was 0.1 wt %.

An amount of 10.6 g of the raw material liquid D, 27.6 g of a fine silica particle dispersion identical to that used in Example 1, and 61.7 g of 2-propanol were mixed by stirring to obtain a coating liquid D4.

In the coating liquid D4, the concentration of solids of silicon oxide (derived from the fine silica particles and tetraalkoxysilane) in terms of $SiO_2$ was 7.0 wt %, the fine particles:binder ratio was 91:9, and the aluminum compound content was 0.15 parts by mass.

This coating liquid D4 differs from the coating liquid of Example 1 of Patent Literature 1 in that the coating liquid D4 was prepared using an aqueous solvent and had a solids concentration suitable for application with a roll coater. However, a mass ratio, expressed as fine silica particles:$SiO_2$ derived from tetraalkoxysilane:aluminum nitrate in terms of $Al_2O_3$, was equal for the coating liquids.

<Formation of Low-Reflection Coating>

In Comparative Example 4, a low-reflection coating was formed in the same manner as in Example 1 except for using the coating liquid D4, and the various properties of the low-reflection coating were evaluated. The results are shown in Table 1.

Comparative Example 5

<Preparation of Coating Liquid>

An amount of 30.3 parts by mass of a fine silica particle dispersion identical to that used in Example 1, 58.1 parts by mass of ethyl cellosolve (solvent), and 1 part by mass of 1N hydrochloric acid (hydrolysis catalyst) were mixed by stirring, and 10.4 parts by weight of tetraethoxysilane identical to that used in Example 1 was added to the mixture under continuous stirring. The stirring was continued for additional 8 hours while maintaining a temperature of 40° C. to hydrolyze the tetraethoxysilane, thus yielding a raw material liquid E.

In the raw material liquid E, the fine particles:binder ratio was 70:30, and the concentration of solids in terms of $SiO_2$ was 10 wt %.

An amount of 7.0 g of the raw material liquid E, 83.8 g of propylene glycol (solvent), and 9.2 g of zirconium oxychloride octahydrate (special reagent grade, manufactured by KANTO CHEMICAL CO., INC.) were mixed by stirring to obtain a coating liquid E5.

In the coating liquid E5, the concentration of solids of silicon oxide (derived from the fine silica particles and tetraalkoxysilane) in terms of $SiO_2$ was 7.0 wt %, and the amount of the zirconium compound in terms of $ZrO_2$ relative to 100 parts by mass of the silicon oxide in terms of $SiO_2$ was 5 parts by mass.

This coating liquid E5 differs from the coating liquid of Example 13 of Patent Literature 1 in that the coating liquid E5 had a solids concentration suitable for application with a roll coater and contained no surfactant. However, a mass ratio, expressed as fine silica particles: $SiO_2$ derived from tetraalkoxysilane zirconium compound in terms of $ZrO_2$, was equal for the coating liquids.

<Formation of Low-Reflection Coating>

In Comparative Example 5, a low-reflection coating was formed in the same manner as in Example 1 except for using the coating liquid E5, and the various properties of the low-reflection coating were evaluated. The results are shown in Table 1.

Comparative Example 6

<Preparation of Coating Liquid>

An amount of 7.0 g of the raw material liquid E, 63.0 g of propylene glycol (solvent), and 30.0 g of titanium tetraacetylacetonate (2-propanol solution with a solids concentration of 65 wt %, ORGATIX TC-401, manufactured by MATSUMOTO TRADING Co., Ltd.) were mixed by stirring to obtain a coating liquid E6.

In the coating liquid E6, the concentration of solids of silicon oxide (derived from the fine silica particles and tetraalkoxysilane) in terms of $SiO_2$ was 7.0 wt %, and the amount of the titanium compound in terms of $TiO_2$ relative to 100 parts by mass of the silicon oxide in terms of $SiO_2$ was 5 parts by mass.

This coating liquid E6 differs from the coating liquid of Example 15 of Patent Literature 2 in that the coating liquid E6 had a solids concentration suitable for application with a roll coater and contained no surfactant. However, a mass ratio, expressed as fine silica particles: $SiO_2$ derived from tetraalkoxysilane titanium compound in terms of $TiO_2$, was equal for the coating liquids.

<Formation of Low-Reflection Coating>

In Comparative Example 6, a low-reflection coating was formed in the same manner as in Example 1 except for using the coating liquid E6, and the various properties of the low-reflection coating were evaluated. The results are shown in Table 1.

Comparative Example 7

<Aging Following Drying and Curing>

The low-reflection coating of Comparative Example 1 was subjected to the same aging as performed in Example 6. The various properties of the low-reflection coating subjected to the aging were evaluated. The results are shown in Table 1.

As demonstrated by Examples 1 to 5, the low-reflection coatings finished only through curing by hot air drying yielded a transmittance gain of 2.5% or more and, in particular, the low-reflection coating of Example 4 yielded a considerably high transmittance gain of 2.99%. The change in average transmittance before and after the salt spray test was 0.15% or less for the low-reflection coatings and, in particular, the coating of Example 5 had such a considerably high salt spray resistance that the change in average transmittance before and after the salt spray test was 0.05%. In addition, the coatings of Examples 1 to 5 showed such a high alkali resistance that the change in average transmittance before and after the alkali resistance test was 0.6% or less and such a high moisture resistance that the change in average transmittance before and after the pressure cooker test was 0.2% or less.

Furthermore, as demonstrated by Example 6, the low-reflection coating finished through curing by hot air drying and the subsequent aging showed such a considerably high salt spray resistance that the average transmittance remained unchanged before and after the salt spray test. Improvement by aging was observed also for the alkali resistance and moisture resistance.

This indicates that when a photoelectric conversion device provided with the low-reflection coating of the present invention is installed in an environment where the device is exposed to sunlight, the salt spray resistance, alkali resistance, and moisture resistance of the coating are further improved within a relatively short time after the installation as compared to those of the coating as freshly formed.

In Comparative Examples 1 and 2 where the low-reflection coatings had an aluminum compound content of less than 2 mass %, the change in transmittance before and after the salt spray test was more than 0.15%, which proves that these coatings had poor salt spray resistance. In addition, the change in average transmittance before and after the pressure cooker test was 0.6% or more for these coatings, which proves that they had poor moisture resistance.

In Comparative Example 3, the aluminum compound content was more than 7 mass %. This led to a deterioration in low-reflection properties and hence to a low transmittance gain of 2.4%. The salt spray resistance, alkali resistance, and moisture resistance were also poor.

In Comparative Example 4, the low-reflection coating contained an aluminum compound derived from aluminum nitrate incorporated into the coating liquid and had an aluminum compound content of less than 2 mass %, so that the low-reflection coating had poor salt spray resistance as well as having very poor alkali resistance and very poor moisture resistance.

In Comparative Examples 5 and 6, the low-reflection coatings contained zirconium oxide and titanium oxide, respectively, instead of an aluminum compound and thus had poor salt spray resistance and poor moisture resistance. Zirconium oxide and titanium oxide are known as substances which can improve these resistances; however, zirconium oxide and titanium oxide cannot provide the improving effect when drying and curing are performed at low temperatures.

Furthermore, the transmittance gains in Comparative Examples 5 and 6 were low and 2.4% and 2.3%, respectively, which demonstrates that there was a deterioration in low-reflection properties.

In Comparative Example 7, the salt spray resistance was improved as compared to that in Comparative Example 1 where aging was not performed. However, the change in average transmittance was still 0.15% or more, which means that the salt spray resistance was insufficient. The moisture resistance was also unsatisfactory.

TABLE 1

|  |  |  | Examples | | | | | |
|---|---|---|---|---|---|---|---|---|
|  |  |  | 1 | 2 | 3 | 4 | 5 | 6 |
| Low-reflection coating | | | | | | | | |
| Fine particles |  | Mass % | 61.9 | 63.1 | 60.7 | 66.4 | 57.1 | 61.9 |
| Binder | Silica | Mass % | 33.3 | 34.0 | 32.7 | 28.4 | 38.1 | 33.3 |
|  | Aluminum compound | *Mass % | 4.8 | 2.9 | 6.5 | 5.2 | 4.8 | 4.8 |
|  | Another component | Type | — | — | — | — | — | — |
|  |  | Mass % | — | — | — | — | — | — |
| Components | | | | | | | | |
| Silica component | Fine particles | Mass ratio | 65 | 65 | 65 | 70 | 60 | 65 |
|  | Binder | Mass ratio | 35 | 35 | 35 | 30 | 40 | 35 |

TABLE 1-continued

|  |  |  |  |  |  |  |  |  |
|---|---|---|---|---|---|---|---|---|
| Aluminum compound |  | Type | AlCl₃ | AlCl₃ | AlCl₃ | AlCl₃ | AlCl₃ | AlCl₃ |
|  |  | **Parts by mass | 5 | 3 | 7 | 5.5 | 5 | 5 |
| Another component |  | Type | — | — | — | — | — | — |
|  |  | **Parts by mass | — | — | — | — | — | — |
|  | Properties |  |  |  |  |  |  |  |
|  | Thickness/nm |  | 140 | 140 | 140 | 140 | 140 | 140 |
|  | Average transmittance/% |  | 82.83 | 82.88 | 82.75 | 82.99 | 82.72 | 82.83 |
|  | Transmittance gain/% |  | 2.83 | 2.88 | 2.75 | 2.99 | 2.72 | 2.83 |
|  | Salt spray test (JIS C 8917)/% |  | 0.06 | 0.07 | 0.07 | 0.09 | 0.05 | 0 |
|  | Alkali resistance test/% |  | 0.53 | 0.55 | 0.58 | 0.58 | 0.50 | 0.18 |
|  | Pressure cooker test/% |  | 0.13 | 0.15 | 0.18 | 0.20 | 0.10 | 0.09 |

|  |  |  | Comparative Examples |  |  |  |  |  |  |
|---|---|---|---|---|---|---|---|---|---|
|  |  |  | 1 | 2 | 3 | 4 | 5 | 6 | 7 |
| Low-reflection coating |  |  |  |  |  |  |  |  |  |
| Fine particles |  | Mass % | 65.0 | 64.4 | 59.1 | 90.86 | 66.7 | 66.7 | 65.0 |
| Binder | Silica | Mass % | 35.0 | 34.7 | 31.8 | 8.99 | 28.6 | 28.6 | 35.0 |
|  | Aluminum compound | *Mass % | 0 | 1.0 | 9.1 | 0.15 | 0 | 0 | 0.0 |
|  | Another component | Type | — | — | — | — | ZrO₂ | TiO₂ | — |
|  |  | Mass % | — | — | — | — | 4.8 | 4.8 | — |
|  | Components |  |  |  |  |  |  |  |  |
| Silica component | Fine particles | Mass ratio | 65 | 65 | 65 | 91 | 70 | 70 | 65 |
|  | Binder | Mass ratio | 35 | 35 | 35 | 9 | 30 | 30 | 35 |
| Aluminum compound |  | Type | — | AlCl₃ | AlCl₃ | Al(NO₃)₃ | — | — | — |
|  |  | **Parts by mass | 0 | 1 | 10 | 0.15 | 0 | 0 | 0 |
| Another component |  | Type | — | — | — | — | ZrO₂ | TiO₂ | — |
|  |  | **Parts by mass | — | — | — | — | 5 | 5 | — |
|  | Properties |  |  |  |  |  |  |  |  |
|  | Thickness/nm |  | 140 | 140 | 140 | 140 | 140 | 140 | 140 |
|  | Average transmittance/% |  | 82.80 | 82.82 | 82.40 | 82.80 | 82.40 | 82.30 | 82.71 |
|  | Transmittance gain/% |  | 2.80 | 2.82 | 2.40 | 2.80 | 2.40 | 2.30 | 2.71 |
|  | Salt spray test (JIS C 8917)/% |  | 0.30 | 0.33 | 0.40 | 2.48 | 0.35 | 0.98 | 0.21 |
|  | Alkali resistance test/% |  | 0.65 | 0.65 | 0.70 | 2.50 | 0.60 |  |  |
|  | Pressure cooker test/% |  | 0.61 | 0.60 | 1.10 | 1.80 | 1.40 | 0.80 | 0.80 |

*Mass % of aluminum compound in terms of Al₂O₃
**Parts by mass of compound in terms of metal oxide relative to 100 parts by mass of silica component in terms of SiO₂

Reference Examples

One and the same coating liquid was used to form a low-reflection coating on various glass sheets differing in surface reflectance, and low-reflection coated substrates were thus prepared as reference examples for examining how the transmittance gain obtained by formation of a low-reflection coating changes with the variation in reflectance of the glass sheet surface having no low-reflection coating formed thereon.

First, glass sheets differing in the tin oxide concentration in one principal surface and thus differing in the reflectance of the one principal surface were prepared.

The glass sheet used in Reference Example 1 was a a transparent conductive film-coated glass sheet manufactured by Nippon Sheet Glass Co. Ltd. This glass sheet had a typical soda-lime-silicate composition, had one principal surface coated with a transparent conductive film formed by on-line CVD and including a transparent conductive layer, and had a thickness of 3.2 mm. A low-reflection coating formed in Reference Example 1 produced an improvement in transmittance of the transparent conductive film-coated glass sheet. The average transmittance of the transparent conductive film-coated glass sheet was determined to be 83.64% when the transmission properties of the glass sheet were evaluated in the manner described above before the provision of the low-reflection coating.

The glass sheets used in Reference Examples 2 to 5 were also transparent conductive film-coated glass sheets manufactured by Nippon Sheet Glass Co. Ltd. The transparent conductive film was identical to that in Reference Example 1. The glass sheets were those produced by varying the tin oxide concentration and atmosphere in the float bath so that the glass sheets had different tin oxide concentrations in one principal surface not coated with the transparent conductive film. Each of the glass sheets had a typical soda-lime-silicate glass composition and had a thickness of 3.2 mm. The average transmittance was about 80% for these glass sheets.

The glass sheets used in Reference Examples 6 and 8 were float glass sheets manufactured by Nippon Sheet Glass Co. Ltd., having a thickness of 3.2 mm, and having a typical soda-lime-silicate composition, and neither of the principal surfaces of each glass sheet were coated with a transparent conductive film. In Reference Example 6, a low-reflection coating was provided on that principal surface of the glass sheet which had been brought into contact with the float bath, while in Reference Example 8, a low-reflection coating was provided on that principal surface of the glass sheet which had not been brought into contact with the float bath. As shown in Table 2, no tin oxide was detected in the principal surface of the glass sheet which had not been brought into contact with the float bath (Reference Example 8). The average transmittance was about 90% for these glass sheets.

The glass sheets used in Reference Examples 7 and 9 were also 3.2-mm-thick float glass sheets manufactured by Nippon Sheet Glass Co. Ltd. and having a soda-lime-silicate composition, and neither of the principal surfaces of each glass sheet were coated with a transparent conductive film. In Reference Example 7, a low-reflection coating was provided on that principal surface of the glass sheet which had been brought into contact with the float bath, while in Reference Example 9, a low-reflection coating was provided on that principal surface of the glass sheet which had not been brought into contact with the float bath. As shown in Table 2, no tin oxide was detected in the principal surface of the glass sheet which had not been brought into contact with the float bath (Reference Example 9). For these glass sheets, the average transmittance was about 90.8%, which was higher than that for the glass sheets of Reference Examples 6 and 8.

As in Example 1, the glass sheets of Reference Examples 1 to 9 were processed by cutting, washing, and drying to prepare glass sheets for low-reflection coating formation.

The transmission properties of the glass sheets of Reference Examples 1 to 9 were evaluated in the manner described above before the provision of low-reflection coatings. For that principal surface of each glass sheet on which a low-reflection coating was to be provided, the average reflectance in the wavelength range of 380 to 850 nm and the tin oxide concentration in the outermost portion of the principal surface were also measured.

The average reflectance was determined by measuring a reflectance curve (reflection spectrum) using a spectrophotometer (UV-3100PC, manufactured by Shimadzu Corporation) at an incident angle of 8° and averaging the values of reflectance over the wavelength range of 380 to 850 nm. Before the measurement of the reflection spectrum, the principal surface opposite to the light-incident side was treated to eliminate the influence of the opposite principal surface on the reflectance measurement. Specifically, when the glass sheet used was a transparent conductive film-coated glass sheet and a low-reflection coating was to be provided on the surface not coated with the transparent conductive film, the transparent conductive film was removed by sandblasting, followed by application of a black paint. When the glass sheet used was not coated with any transparent conductive film, a black paint was applied to the principal surface opposite to the light-incident side.

The tin oxide concentration in the outermost portion of the principal surface was measured using an electron probe micro-analyzer (EPMA) and a wavelength-dispersive X-ray detector (WDX) attached to the micro-analyzer. Specifically, WDX analysis (accelerating voltage: 15 kV, sample current: $2.5 \times 10^{-7}$ A, scan speed: 6 μm/min, dispersive crystal: PET) was performed using an EPMA (JXA 8600, manufactured by JEOL Ltd.).

A low-reflection coating was provided on one principal surface (the surface for which the average reflectance and tin oxide concentration were measured) of each glass sheet by using the same coating liquid A1 and procedures as used in Example 1. For each of the obtained low-reflection coated substrates of Reference Examples 1 to 9, the average reflectance at the the low-reflection coated surface was measured in the same manner as the average reflectance of the glass sheet, and the above transmission properties were also evaluated.

Table 2 shows: the average transmittance of each low-reflection coated substrate (transmittance measured after coating); the transmittance gain representing the increase in average transmittance relative to the glass sheet not provided with the low-reflection coating; the average reflectance of the glass sheet not provided with the low-reflection coating; and the decrease in average reflectance (reflectance loss) of the low-reflection coated substrate relative to the glass sheet not provided with the low-reflection coating.

TABLE 2

| | $SnO_2$ concentration (mass %) | Reflectance | | Transmittance | |
| --- | --- | --- | --- | --- | --- |
| | | Before coating (%) | Reflectance loss (%) | After coating (%) | Transmittance gain (%) |
| Reference Example 1 | 9.6 | 5.67 | 3.70 | 86.50 | 2.87 |
| Reference Example 2 | 8.8 | 5.59 | 3.63 | 82.89 | 2.74 |
| Reference Example 3 | 9.5 | 5.66 | 3.83 | 83.11 | 2.84 |
| Reference Example 4 | 10.4 | 5.75 | 3.97 | 83.30 | 2.84 |
| Reference Example 5 | 11.0 | 5.82 | 4.07 | 83.16 | 2.87 |
| Reference Example 6 | 10.0 | 5.71 | 3.90 | 93.60 | 3.58 |
| Reference Example 7 | 5.7 | 5.27 | 3.41 | 93.91 | 3.09 |
| Reference Example 8 | NA | 4.77 | 2.73 | 92.41 | 2.38 |
| Reference Example 9 | NA | 4.62 | 2.59 | 93.19 | 2.37 |

Figure 2:
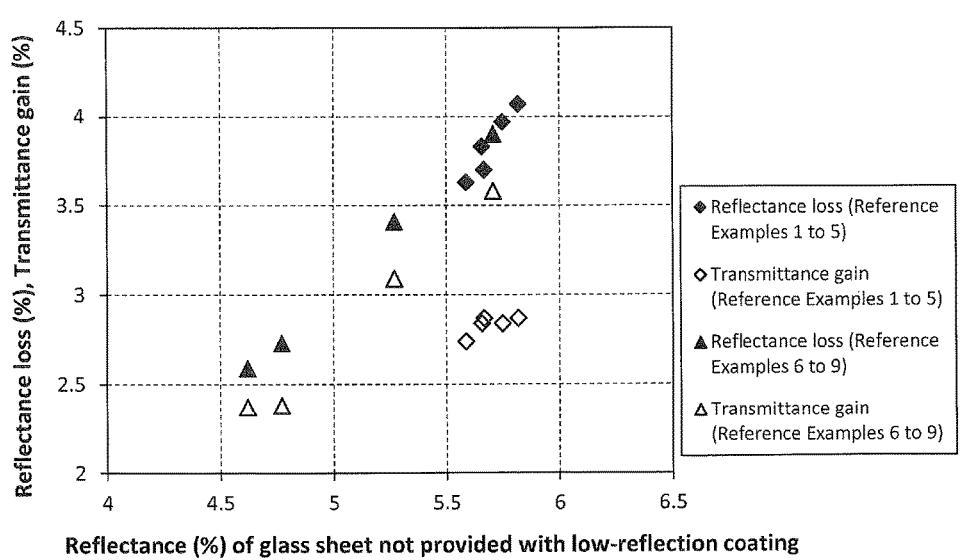
FIG. 2 is a graph showing, for each of the low-reflection coated substrates of Reference Examples 1 to 9, the relationship of the average reflectance of one principal surface of a glass sheet not provided with a low-reflection coating versus the reflectance loss and transmittance gain at the low-reflection coated principal surface of the glass sheet provided with the low-reflection coating.

FIG. 2 shows the relationship of the average reflectance of one principal surface of the glass sheet not provided with the low-reflection coating (reflectance measured before coating) versus the average reflectance decrease (reflection loss) and transmittance gain at the low-reflection coated principal surface of the glass sheet provided with the low-reflection coating.

These results confirmed that the higher the average reflectance of the glass sheet not provided with the low-reflection coating is, the greater the reflection loss is, and consequently the higher the resulting transmittance gain is.

The results in Reference Examples 1 to 9 lead to the observation that the transmittance gain was a little below 80% of the reflection loss for the low-reflection coated substrates of Reference Examples 1 to 5 prepared using transparent conductive film-coated glass sheets, while for the low-reflection coated substrates of Reference Examples 6 to 9 prepared using float glass sheets, the transmittance gain was about 90% of the reflection loss.

This leads to the expectation that a transmittance gain of 2.5% or more is likely to be achieved when the decrease in average reflectance is about 3.15% or more. FIG. 2 shows that a decrease in reflectance of 3.15% or more can be achieved when the surface of the glass sheet has an average reflectance of 5.1% or more.

This leads to the conclusion that a transmittance gain of 2.5% or more is likely to be achieved by providing the low-reflection coating of the present invention on a glass sheet having a reflectance of 5.1% or more.

INDUSTRIAL APPLICABILITY

The present invention can provide a low-reflection coating that yields a high transmittance gain and has good salt spray resistance despite being formed though curing at a low temperature.

The invention claimed is:
1. A low-reflection coated substrate, comprising:
a glass sheet; and
a low-reflection coating formed on at least one principal surface of the glass sheet, wherein the low-reflection coating is a porous film and comprises:
fine silica particles that are solid and spherical and have an average particle diameter of 80 to 150 nm; and
a binder containing silica as a main component,
wherein the fine silica particles are bound together by the binder, and the binder further contains an aluminum compound,
wherein the low-reflection coating contains the following components:
55 to 70 mass % of the fine silica particles;
25 to 40 mass % of the silica of the binder; and
2 to 7 mass % of the aluminum compound expressed in a form of $Al_2O_3$,
the low-reflection coating has a thickness of 80 to 800 nm,
the low-reflection coating yields a transmittance gain of 2.5% or more, the transmittance gain representing an increase in average transmittance of the glass sheet provided with the low-reflection coating relative to the glass sheet not provided with the low-reflection coating, the average transmittance being measured in the wavelength range of 380 to 850 nm,
the principal surface has an average reflectance of 5.1% or more at a wavelength range of 380 to 850 nm when measured in the absence of the low-reflection coating on the principal surface, and
an outermost portion of the principal surface having the low-reflection coating formed thereon contains 3.5 to 24 mass % of tin oxide.

2. The low-reflection coated substrate according to claim 1,
wherein an average particle diameter of the fine silica particles is in a range from more than 100 nm to 150 nm or less.

3. The low-reflection coated substrate according to claim 1, wherein, in the low-reflection coating, the content of the aluminum compound is 5.2 mass % or more expressed in the form of $Al_2O_3$.

4. The low-reflection coated substrate according to claim 1,
wherein the silica of the binder is derived from a hydrolyzable silicon compound, or a hydrolysate of the hydrolyzable silicon compound, and
the hydrolyzable silicon compound comprises a compound represented by the following formula (I):

$$SiX_4 \qquad (I),$$

where X is at least one selected from an alkoxy group, an acetoxy group, an alkenyloxy group, an amino group, and a halogen atom.

5. The low-reflection coated substrate according to claim 4, wherein the hydrolyzable silicon compound is tetraalkoxysilane.

6. The low-reflection coated substrate according to claim 1, wherein the aluminum compound is derived from an aluminum halide added to a coating liquid for forming the low-reflection coating.

7. The low-reflection coated substrate according to claim 6, wherein the aluminum halide is aluminum chloride.

8. The low-reflection coated substrate according to claim 1,
wherein a difference of average transmittance of the low-reflection coated substrate before and after a salt spray test has an absolute value of 0.15% or less,
wherein the salt spray test is conducted in accordance with JIS C 8917: 2005, Annex 4.

9. The low-reflection coated substrate according to claim 1,
wherein the low-reflection coated substrate is obtained by applying a coating liquid for forming the low-reflection coating on the glass sheet and then heating the glass sheet,
wherein the heating includes exposing a surface of the glass sheet to a maximum temperature of 350° C. or lower, and
a duration during which the surface of the glass sheet has a temperature of 200° C. or higher is 5 minutes or less.

10. The low-reflection coated substrate according to claim 1,
wherein the low-reflection coated substrate is obtained by applying a coating liquid for forming the low-reflection coating on the glass sheet and then heating the glass sheet,
wherein the heating includes exposing a surface of the glass sheet to a maximum temperature of 250° C. or lower, and
a duration during which the surface of the glass sheet has a temperature of 100° C. or higher is 2 minutes or less.

11. The low-reflection coated substrate according to claim 1,
wherein the glass sheet is a float glass sheet produced by a float process,
the low-reflection coating is formed on a principal surface of the glass sheet, and
the principal surface is a surface that has been placed in contact with a float bath during production of the glass sheet by the float process.

12. The low-reflection coated substrate according to claim 1,
wherein
the low-reflection coated substrate further comprises a transparent conductive film formed on a principal surface of the glass sheet opposing the principal surface having the low-reflection coating formed thereon.

13. A photoelectric conversion device comprising:
a low-reflection coated substrate according to claim 1, wherein the principal surface is a surface on which light is incident.

* * * * *